(12) United States Patent
Yuan et al.

(10) Patent No.: US 11,189,698 B2
(45) Date of Patent: Nov. 30, 2021

(54) SEMICONDUCTOR POWER DEVICE

(71) Applicant: SUZHOU ORIENTAL SEMICONDUCTOR CO., LTD., Jiangsu (CN)

(72) Inventors: Yuanlin Yuan, Jiangsu (CN); Wei Liu, Jiangsu (CN); Zhendong Mao, Jiangsu (CN); Lei Liu, Jiangsu (CN); Rui Wang, Jiangsu (CN); Yi Gong, Jiangsu (CN)

(73) Assignee: SUZHOU ORIENTAL SEMICONDUCTOR CO., LTD, Jiangsu (CN)

( * ) Notice: Subject to any disclaimer, the term of this patent is extended or adjusted under 35 U.S.C. 154(b) by 0 days.

(21) Appl. No.: 16/645,016

(22) PCT Filed: Nov. 26, 2018

(86) PCT No.: PCT/CN2018/117414
§ 371 (c)(1),
(2) Date: Mar. 6, 2020

(87) PCT Pub. No.: WO2019/128587
PCT Pub. Date: Jul. 4, 2019

(65) Prior Publication Data
US 2020/0258983 A1 Aug. 13, 2020

(30) Foreign Application Priority Data

Dec. 29, 2017 (CN) .......................... 201711481071.8
Dec. 29, 2017 (CN) .......................... 201711481167.4
(Continued)

(51) Int. Cl.
*H01L 29/06* (2006.01)
*H01L 29/10* (2006.01)
*H01L 29/73* (2006.01)

(52) U.S. Cl.
CPC ...... *H01L 29/1095* (2013.01); *H01L 29/0615* (2013.01); *H01L 29/0696* (2013.01)

(58) Field of Classification Search
CPC ......... H01L 29/06; H01L 29/10; H01L 29/42; H01L 29/73; H01L 29/1095;
(Continued)

(56) References Cited

U.S. PATENT DOCUMENTS

| 2010/0155773 A1* | 6/2010 | Parthasarathy ... H01L 29/66348 257/139 |
| 2010/0155831 A1* | 6/2010 | Parthasarathy ... H01L 29/66348 257/329 |

(Continued)

FOREIGN PATENT DOCUMENTS

| CN | 102487078 A | 6/2012 |
| CN | 102856385 A | 1/2013 |

(Continued)

OTHER PUBLICATIONS

International Search Report on International Application No. PCT/CN2018/117414, dated Feb. 25, 2019 (4 pages).

*Primary Examiner* — Fazli Erdem
(74) *Attorney, Agent, or Firm* — Buchanan Ingersoll & Rooney PC

(57) ABSTRACT

Disclosed is a semiconductor power device, including a semiconductor substrate; a MOSFET region formed on the semiconductor substrate, where the MOSFET region includes at least one MOSFET unit; and at least one collector region located in the semiconductor substrate, where the collector region and the MOSFET unit form an insulated gate bipolar transistor.

10 Claims, 5 Drawing Sheets

(30) Foreign Application Priority Data

Dec. 29, 2017 (CN) .......................... 201711489809.5
Dec. 29, 2017 (CN) .......................... 201711489817.X

(58) Field of Classification Search
CPC ............. H01L 29/0615; H01L 29/0696; H01L 29/4236; H01L 29/7393; H01L 29/7397
USPC .......................................................... 257/341
See application file for complete search history.

(56) References Cited

U.S. PATENT DOCUMENTS

| | | | | |
|---|---|---|---|---|
| 2011/0140166 A1* | 6/2011 | Parthasarathy | ..... | H01L 29/7397 257/139 |
| 2013/0336033 A1* | 12/2013 | Hirler | ................. | H01L 29/7804 363/124 |
| 2015/0279985 A1* | 10/2015 | Philippou | ........... | H01L 29/4236 257/334 |
| 2016/0163852 A1* | 6/2016 | Siemieniec | ....... | H01L 29/66348 257/77 |
| 2017/0221989 A1 | 8/2017 | Hirler et al. | | |

FOREIGN PATENT DOCUMENTS

| | | |
|---|---|---|
| CN | 103579230 A | 2/2014 |
| CN | 103579231 A | 2/2014 |

* cited by examiner

SEMICONDUCTOR POWER DEVICE

The present disclosure claims the priorities of Chinese patent application No. 201711481071.8, filed on Dec. 29, 2017, Chinese patent application No. 201711489817.X filed on Dec. 29, 2017, Chinese patent application No. 201711489809.5 filed on Dec. 29, 2017, and Chinese patent application No. 201711481167.4 filed on Dec. 29, 2017, disclosure of which are incorporated herein by reference in its entirety.

TECHNICAL FIELD

The present disclosure relates to the technical field of semiconductor devices, for example, a semiconductor power device.

BACKGROUND

A semiconductor power device includes a planar diffused metal oxide semiconductor (MOS) transistor, a groove MOS transistor, and the like. The groove MOS transistor adopts a vertical current channel structure, and thus an area of the groove MOS transistor is much smaller than that of the planar diffused MOS transistor, such that a current density of the groove MOS transistor may be increased. FIG. 1 shows a cross-sectional structure of a groove MOS transistor in the related art, including a drain region 50 located at a bottom of a semiconductor substrate, a source region 53 and a body region 52 located at a top of the semiconductor substrate, a drift region 51 located between the body region 52 and the drain region 50, a current channel located within the body region 52 and between the source region 53 and the drift region 51, and a gate structure configured to control turning on and off of the current channel, where the gate structure is located in a gate groove recessed within the semiconductor substrate, the gate structure includes a gate dielectric layer 54 and a gate 55. Since an electron (or hole) carrier current is formed between the source region 53 and the drain region 50 when a semiconductor power device in the related art is turned on, an output current density of such a single carrier is difficult to be continuously increased. With the continuous development of semiconductor integrated circuit technology, how to increase the output current density of the semiconductor power device has become a problem to be solved by those skilled in the art.

SUMMARY

The present disclosure provides a semiconductor power device, to solve a problem of how to increase an output current density of a semiconductor power device in the related art.

Provided is a semiconductor power device, including a semiconductor substrate, a metal oxide semiconductor field effect transistor (MOSFET) region, and at least one collector region located in the semiconductor substrate. The MOSFET region is formed on the semiconductor substrate and includes at least one MOSFET unit. The collector region and the MOSFET unit form an insulated gate bipolar transistor.

In an embodiment, the collector region surrounds the MOSFET region, or the collector region is located on one side or both sides of the MOSFET region.

In an embodiment, a voltage dividing structure is arranged between the collector region and the MOSFET region, and the voltage dividing structure is a field plate, a field limiting ring, or a groove structure filled with a polysilicon.

In an embodiment, the MOSFET unit includes a drain region with a first conductivity type located at a bottom of the semiconductor substrate, a body region with a second conductivity type and a source region with the first conductivity type both located in the semiconductor substrate, a drift region with the first conductivity type located in the semiconductor substrate and between the drain region and the body region, a current channel located within the body region and between the source region and the drift region, and a gate structure. The drain region is led out from the bottom of the semiconductor substrate to connect to a drain voltage. The source region and the body region are led out from a top of the semiconductor substrate to connect to a source voltage. The gate structure is configured to control turning on and off of the current channel.

In an embodiment, the collector region has the second conductivity type, the first conductivity type is an n-type, the second conductivity type is a p-type, and the collector region, the drift region, the body region and the source region form a p-n-p-n structure.

In an embodiment, the collector region is located on the top of the semiconductor substrate, and led out from the top of the semiconductor substrate to connect to a collector voltage.

In an embodiment, the collector region is located above the drain region, to connect to the drain region to form a pn junction structure.

In an embodiment, a gate groove recessed within the semiconductor substrate is arranged within the semiconductor substrate, and the gate structure is arranged in the gate groove, the gate structure includes a gate dielectric layer and a control gate.

In an embodiment, the gate structure further includes an insulating dielectric layer and a shielded gate, and the shielded gate is separated from the control gate and the drift region through the insulating dielectric layer.

In an embodiment, the semiconductor power device further includes a columnar doped region with the second conductivity type located below the body region, where doped impurities of the columnar doped region and doped impurities of the drift region form a charge balance.

In the semiconductor power device provided by the present disclosure, the MOSFET unit and the collector region are formed in the semiconductor substrate, and the transverse insulated gate bipolar transistor (IGBT) is formed between the collector region, the drift region, the body region, the source region and the gate structure. When the semiconductor power device provided by the present disclosure is turned on, an electron (or hole) carrier current is formed in the MOSFET unit, and a double carrier current including an electron carrier current and a hole carrier current is formed in an IGBT structure, such that the semiconductor power device in the present disclosure can realize the double carrier current including the electron carrier current and the hole carrier current, and therefore can greatly increase the output current density of the semiconductor power device.

BRIEF DESCRIPTION OF DRAWINGS

In order to explain the exemplary embodiments of the present disclosure, the drawings used in the description of the embodiments will be described below.

DETAILED DESCRIPTION

Figure 1:
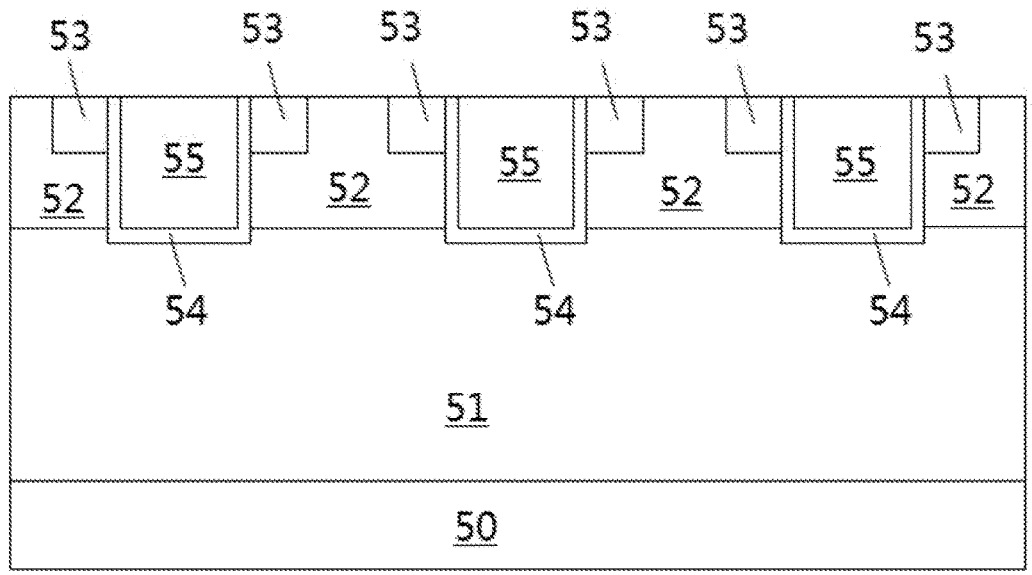
FIG. 1 is a cross-sectional structural schematic diagram of an embodiment of a groove MOS transistor in the related art.

The present disclosure will be described below by way of specific embodiments in conjunction with the drawings in the present embodiment.

The terms such as "having", "including" and "comprising" and the like used in the present embodiment do not exclude the presence or addition of one or more other elements or combinations thereof. Meanwhile, for the purpose of illustrating the specific embodiments of the present disclosure, the thicknesses of the layers and regions described in the present disclosure are exaggerated in the schematic diagrams listed in the drawings, and the size of the listed figures does not represent an actual dimension, the drawings are schematic. The embodiments listed in the Description should not merely limited to the specific shape of the region shown in the drawings, but should include the resulting shape such as a deviation caused by the preparation and the like.

Figure 2:
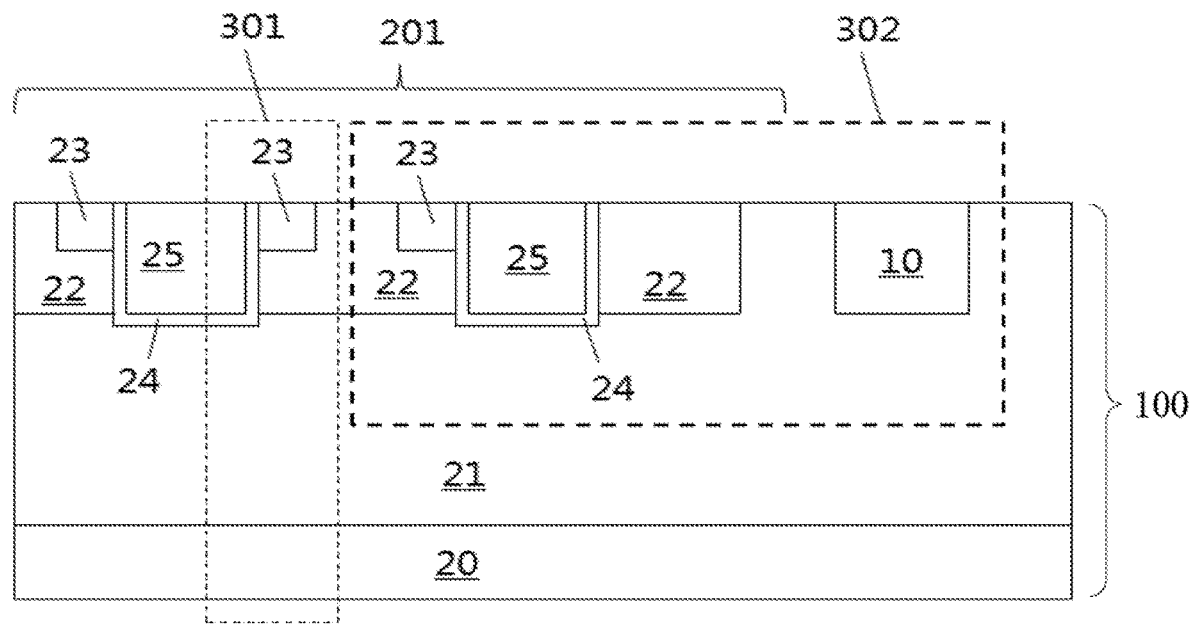
FIG. 2 is a cross-sectional structural schematic diagram of a semiconductor power device provided in an embodiment.

FIG. 2 is a cross-sectional structural schematic diagram of a semiconductor power device provided in the present embodiment. For convenience of showing and explanation, an interlayer insulating layer and a contact metal layer in a chip of the semiconductor power device are not shown in FIG. 2. As shown in FIG. 2, the semiconductor power device provided in the present embodiment includes a semiconductor substrate 100; a metal-oxide-semiconductor field effect transistor (MOSFET) region 201 formed on the semiconductor substrate 100, where the MOSFET region 201 may include at least one MOSFET unit (one MOSFET unit 301 is exemplarily framed); and at least one collector region 10 located in the semiconductor substrate 100, where the collector region 10 and the MOSFET unit form an insulated gate bipolar transistor (one IGBT structure 302 is exemplarily framed). The collector region 10 is located on a top of the semiconductor substrate 100, such that the collector region 10 may be conveniently led out from the top of the semiconductor substrate 100 to connect to a collector voltage, which may be compatible with a fabrication process of the semiconductor power device in the related art, thereby facilitating fabrication of the collector region 10. When the semiconductor power device provided by the present embodiment is turned on, an electron (or hole) carrier current is formed in the MOSFET unit, and a double carrier current including an electron carrier current and a hole carrier current is formed in the IGBT structure, such that the semiconductor power device in the present embodiment can realize the double carrier current including the electron carrier current and the hole carrier current, and therefore can greatly increase a output current density of the semiconductor power device.

For convenience of showing, a structure of one collector region 10 is only exemplarily shown in FIG. 2.

In an embodiment, from a top perspective of the structure shown in FIG. 2, the collector region 10 may surround the MOSFET region 201, or the collector region 10 may be located on one or both sides of the MOSFET region 201, this structure viewed from the top perspective is not shown in the drawings of the present embodiment.

In order to improve a withstand voltage between the collector region 10 and a source region 23 of the MOSFET unit, a distance between the collector region 10 and the MOSFET region 201 may be appropriately increased, or a voltage dividing structure may be added between the collector region 10 and the MOSFET region 201. This voltage dividing structure may be a field plate, a field limiting ring, or a groove structure filled with a polysilicon, where numbers of the field plate, the field limiting ring and the groove structure provided with the polysilicon may be set according to the requirement of an actual product. These voltage dividing structures are commonly structures for improving a withstand voltage of the semiconductor power device, and are not described and shown in the present embodiment.

As shown in FIG. 2, the MOSFET unit in the semiconductor power device of the present embodiment includes: a drain region 20 with a first conductivity type located at a bottom of the semiconductor substrate 100, where the drain region 20 is led out from the bottom of the semiconductor substrate 100 to connect to a drain voltage; a body region 22 with a second conductivity type and a source region 23 with the first conductivity type located in the semiconductor substrate 100, where the source region 23 and the body region 22 are led out from the top of the semiconductor substrate 100 to connect to a source voltage; a drift region 21 with the first conductivity type located in the semiconductor substrate 100 and between the drain region 20 and the body region 22; a current channel located within the body region 22 and between the source region 23 and the drift region 21; and a gate structure configured to control turning on and off of the current channel, where the gate structure is located in or above the semiconductor substrate 100.

The current channel is accumulation and inversion layers that formed on a surface of a semiconductor when a gate voltage is applied to the gate structure in the semiconductor power device. In the drawings of the present embodiment, a structure of the current channel in the semiconductor power device is not shown.

The gate structure in the semiconductor power device provided in the present embodiment may be a planar gate structure or a groove gate structure. When the gate structure is the planar gate structure, the gate structure is located above the semiconductor substrate 100; when the gate structure is the groove gate structure, the gate structure is located in a gate groove recessed within the semiconductor substrate 100. In an embodiment of the semiconductor power device shown in FIG. 2, the gate structure adopts the groove gate structure. The gate groove recessed within the semiconductor substrate is arranged within the semiconductor substrate 100, and the gate structure is arranged in this gate groove, where the gate structure includes a gate dielectric layer 24 and a control gate 25, and the control gate 25 is configured to control turning on and off of the current channel between the source region 23 and the drift region 21 by means of being externally connected to the gate voltage.

The first conductivity type described in the present embodiment is an n-type, and the second conductivity type is a p-type. The collector region 10 may be have the second conductivity type, such that the collector region 10, the drift region 21, the body region 22 and the source region 23 form a p-n-p-n structure, the p-n-p-n structure and the gate structure form a transverse insulated gate bipolar transistor.

In an embodiment, the first conductivity type may be a p-type, and the second conductivity type may be an n-type.

Figure 3:
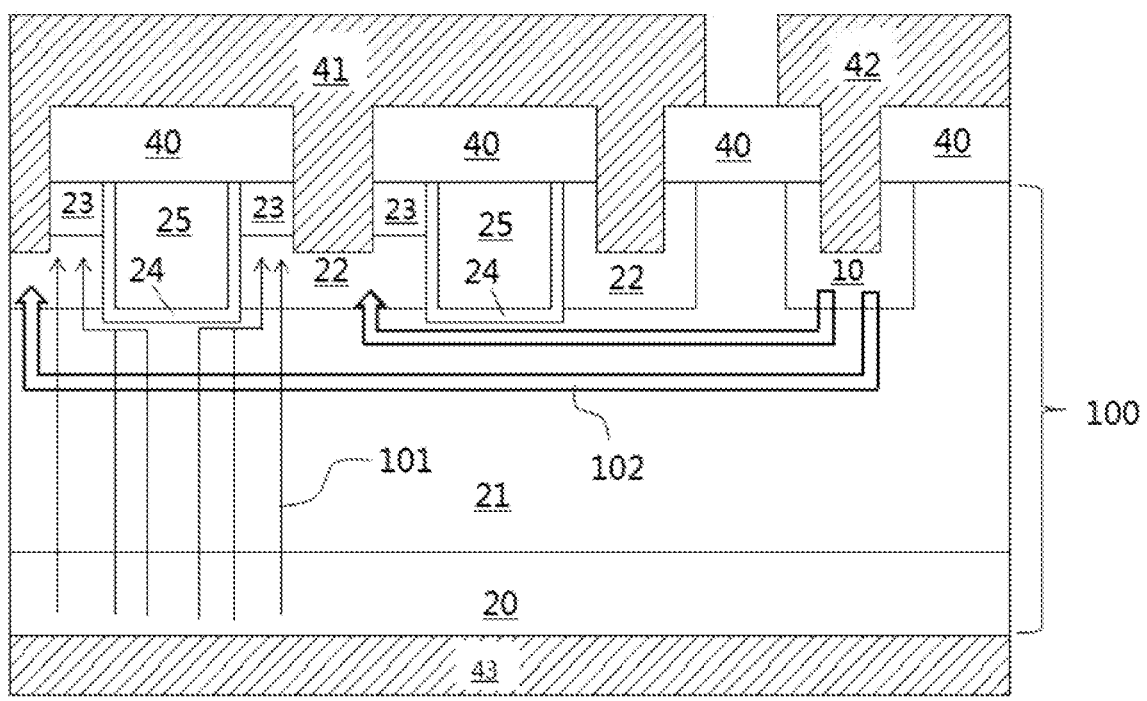
FIG. 3 is a cross-sectional structural schematic diagram of another semiconductor power device provided in an embodiment.

FIG. 3 is a cross-sectional structural schematic diagram of another semiconductor power device provided in the present embodiment. The present embodiment shows the interlayer insulating layer and the contact metal layer in the semiconductor power device shown in FIG. 2. As shown in FIG. 3, a collector region 10 of the semiconductor power device of the present embodiment is led out from a top of the semiconductor substrate 100 to connect to a collector voltage through a collector contact metal layer 42. A source region 23 and a body region 22 are led out from the top of the semiconductor substrate 100 to connect to a source voltage through a source contact metal layer 41, and a drain 20 is led out from a bottom of the semiconductor substrate 100 to connect to a drain voltage through a drain contact metal layer 43. The interlayer insulating layer 40 is used to separate adjacent contact metal layers from each other. The interlayer insulating layer 40 is usually a material such as a silicon glass, a borophosphosilicate glass or a phosphosilicate glass.

In an embodiment of the semiconductor power device shown in FIG. 3, the body region 22 and the collector region 10 is respectively formed with a contact groove, such that the contact metal layer is formed in the contact groove to reduce a contact resistance. In an embodiment, the collector region 10 and the body region 22 may be respectively formed with a contact region with a high doped concentration, to reduce the contact resistance. This contact structure is not shown in the drawings of the present embodiment.

In the semiconductor power device of the present embodiment, the collector region 10 and the drain region 20 may be electrically connected, that is, the collector contact metal layer 42 and the drain contact metal layer 43 are electrically short-circuited by an external connection. In an embodiment, the semiconductor power device is designed as a four-terminal device composed of a source, a drain, a gate and a collector, and then the collector and the drain are electrically short-circuited in an external circuit; alternatively, the collector contact metal layer 42 and the drain contact metal layer 43 are electrically short-circuited by the external connection and then packaged, such that the semiconductor power device in the present embodiment is designed as a three-terminal device composed of the source, the drain, and the gate. When the collector region 10 and the drain region 20 are electrically connected, a drain voltage applied on the drain region 20 is the same as a collector voltage applied on the collector region 10.

Figure 4:
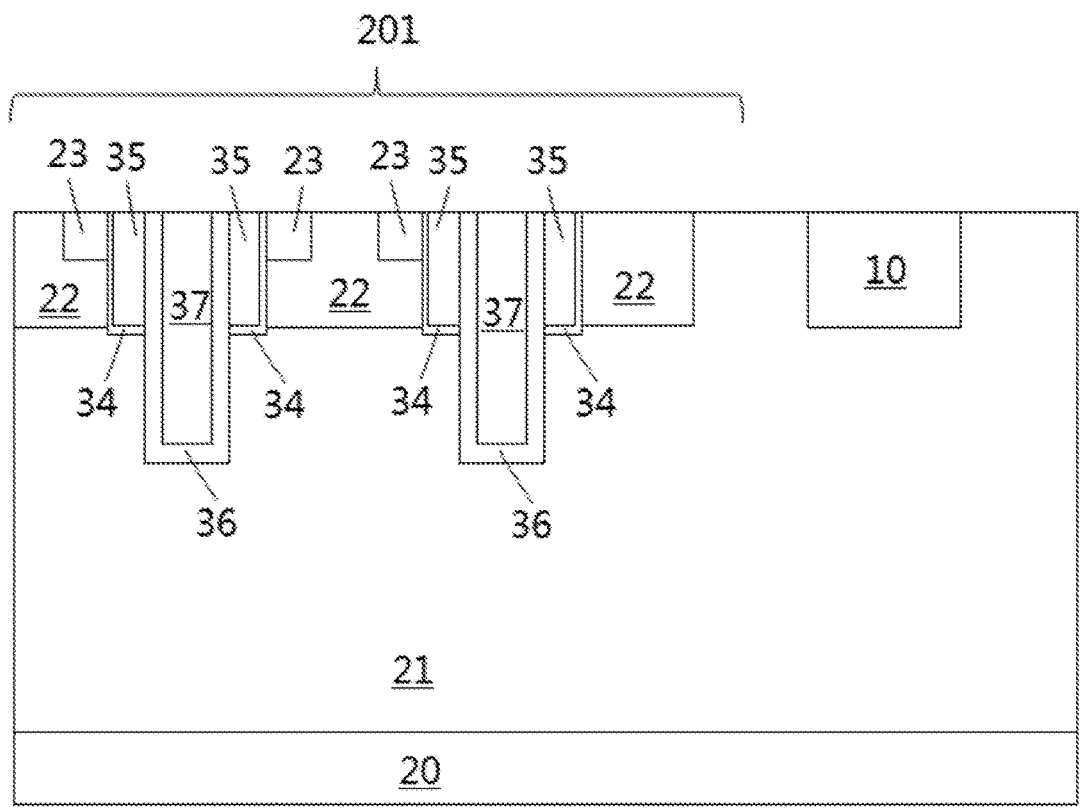
FIG. 4 is a cross-sectional structural schematic diagram of another semiconductor power device provided in an embodiment.

FIG. 4 is a cross-sectional structural schematic diagram of another semiconductor power device provided in the present embodiment. The semiconductor power device shown in FIG. 4 is an embodiment of a gate structure in which the MOSFET unit adopts a gate dividing structure on the basis of the semiconductor power device shown in FIG. 2. As shown in FIG. 4, the gate structure formed in the gate groove in the semiconductor power device provided in the present embodiment includes a gate dielectric layer 34, a control gate 35, an insulating dielectric layer 36 and a shielded gate 37.

The control gate 35 is arranged on both sides of an upper portion of the gate groove, and the shielded gate 37 is separated from the control gate 35 and the drift region 21 through the insulating dielectric layer 36.

The control gate 35 is configured to control turning on and off of the current channel located within the body region 22 and between the source region 23 and the drift region 21 by means of being externally connected to the gate voltage.

The shielded gate 37 may be electrically connected to the source region 23 and connected to the source voltage, such that the shielded gate 37 forms a transverse electric field within the drift region 21 by means of the source voltage, thereby playing a role of reducing an on-resistance and increasing a withstand voltage.

Figure 5:
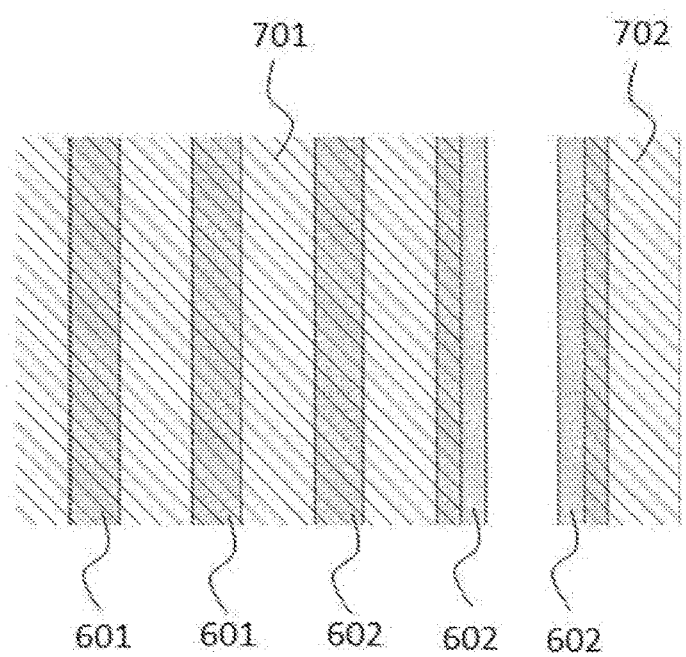
FIG. 5 is a top structural schematic diagram of a semiconductor power device provided in an embodiment.

FIG. 5 is a top structural schematic diagram of a semiconductor power device provided in the present embodiment. The drawing of this embodiment exemplarily shows a voltage dividing structure between a collector region and a MOSFET region in the semiconductor power device of the present embodiment. Three voltage dividing grooves 602 filled with a polysilicon are only exemplarily shown in FIG. 5. The voltage-dividing grooves 602 are located between a gate groove 601 and the collector region (not shown in FIG. 5). The collector region is connected to a collector voltage through a collector contact metal layer 702, and a source region (not shown in FIG. 5) and a body region (not shown in FIG. 5) are led out by the source contact metal layer 701 to connect to a source voltage. The voltage dividing structure in the semiconductor power device of the present embodiment may also be a field plate or a field limiting ring, which is not shown in the present embodiment. In an embodiment, the gate groove 601 and the voltage dividing groove 602 have the same groove structure, and may be formed in a same manufacturing process. FIG. 5 shows the gate groove 601 and the voltage dividing groove 602 in a same filling manner. Likewise, FIG. 5 shows the source contact metal layer 701 and the collector contact metal layer 702 in a same filling manner.

Figure 6:
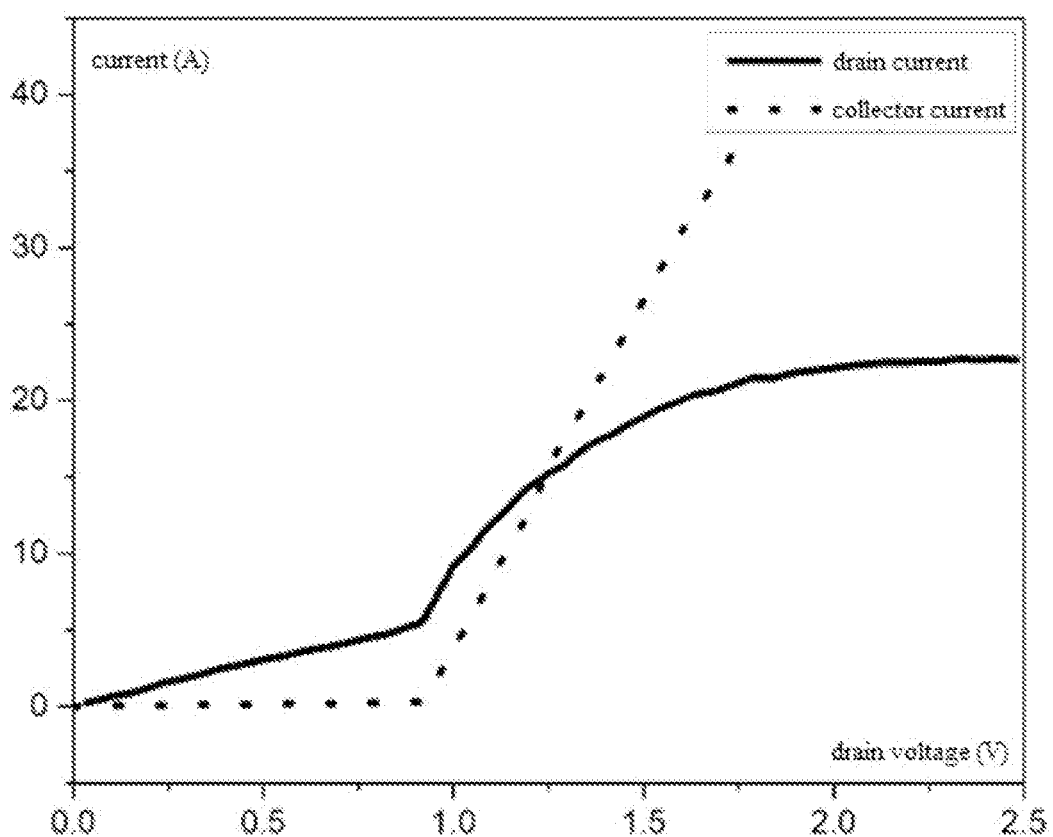
FIG. 6 is a schematic diagram of an output current curve of a semiconductor power device provided in an embodiment.

FIG. 6 is a schematic diagram of an output current curve of the semiconductor power device shown in FIG. 3 provided in the present embodiment. As shown in FIG. 6, the collector region 10 and the drain region 20 of the semiconductor power device of the present embodiment are electrically short-circuited by an external connection, such that the collector region 10 and the drain region 20 are connected to the drain voltage at the same time. When the drain voltage is about 0.9V, an IGBT structure starts to work and injects holes into the semiconductor power device, such that a drain current at a bottom of the semiconductor power device increases significantly.

Figure 7:
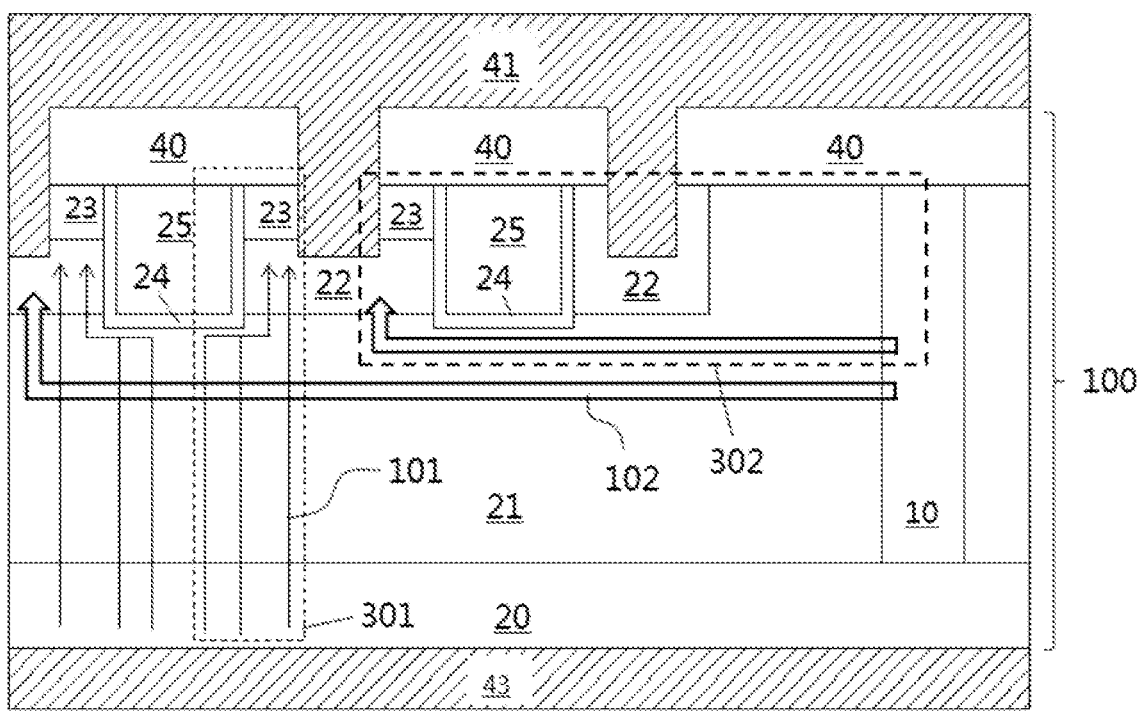
FIG. 7 is a cross-sectional structural schematic diagram of another semiconductor power device provided in an embodiment.

FIG. 7 is a cross-sectional structural schematic diagram of another semiconductor power device provided in the present embodiment. The differences between the semiconductor power device shown in FIG. 7 and the semiconductor power device shown in FIG. 3 are that: a collector region 10 is located in a semiconductor substrate 100 and above a drain region 20, and the collector region 10 is connected to the drain region 20 to form a pn junction structure. The pn junction is formed by a high concentration doped p-type doping and a high concentration doped n-type doping, and thus a large tunneling current exists in the pn junction, the collector region 10 and the drain region 20 are electrically close to short circuit, at this point, the collector region 10 does not need to be led out separately to connect to a collector voltage. When a proper drain voltage is applied to the drain region 20, the pn junction is tunneled, it is equivalent to applying the collector voltage to the collector region 10.

When the collector region 10 is connected to the drain region 20 to form the pn junction, the collector region 10 may be a doped region with a second conductivity type located in the semiconductor substrate 100, or may be a polysilicon conductive pillar with the second conductivity type formed in the semiconductor substrate 100. The collector region 10 being the polysilicon conductive pillar with the second conductivity type formed in the semiconductor substrate 100 is taken as an example and shown in FIG. 7.

In an embodiment, in a MOSFET unit of the semiconductor power device of the present embodiment, a columnar doped region with the second conductivity type may be also formed below a body region. Doped impurities of the columnar doped region and doped impurities in the drift region form a charge balance, such that the MOSFET unit of the semiconductor power device in the present embodiment is a MOSFET structure adopting a super junction structure, and the semiconductor power device having the super junction structure is a common structure in the related art, which is not shown and described in the present embodiment.

What is claimed is:

1. A semiconductor power device, comprising:
   a semiconductor substrate;
   a metal oxide semiconductor field effect transistor (MOSFET) region formed on the semiconductor substrate; and
   at least one collector region with a second conductivity type located in the semiconductor substrate;
   wherein the MOSFET region comprises at least one MOSFET unit, and the MOSFET unit comprises:
   a drain region with a first conductivity type located at a bottom of the semiconductor substrate, wherein the drain region is led out from the bottom of the semiconductor substrate to connect to a drain voltage;
   a body region with the second conductivity type and a source region with the first conductivity type both located in the semiconductor substrate, wherein the source region and the body region are led out from a top of the semiconductor substrate to connect to a source voltage;
   a drift region with the first conductivity type located in the semiconductor substrate and between the drain region and the body region;
   a current channel located within the body region and between the source region and the drift region; and
   a gate structure configured to control turning on and off of the current channel;
   wherein the collector region is located above the drain region, and is connected to the drain region to form a pn junction structure, the collector region and the MOSFET unit form an insulated gate bipolar transistor.

2. The semiconductor power device of claim 1, wherein the collector region surrounds the MOSFET region, or the collector region is located on one side or both sides of the MOSFET region.

3. The semiconductor power device of claim 1, wherein a voltage dividing structure is arranged between the collector region and the MOSFET region, and the voltage dividing structure is a field plate, a field limiting ring, or a groove structure filled with a polysilicon.

4. The semiconductor power device of claim 1, wherein the first conductivity type is an n-type, the second conductivity type is a p-type, and the collector region, the drift region, the body region and the source region form a p-n-p-n structure.

5. The semiconductor power device of claim 1, wherein a gate groove recessed within the semiconductor substrate is arranged within the semiconductor substrate, and the gate structure is arranged in the gate groove, the gate structure comprises a gate dielectric layer and a control gate.

6. The semiconductor power device of claim 5, wherein the gate structure further comprises an insulating dielectric layer and a shielded gate, and the shielded gate is separated from the control gate and the drift region through the insulating dielectric layer.

7. The semiconductor power device of claim 6, wherein the control gate is located on both sides of an upper portion of the gate groove.

8. The semiconductor power device of claim 6, wherein the shielded gate is electrically connected to the source region to connect to the source voltage.

9. The semiconductor power device of claim 1, wherein in condition that the drain voltage is applied to the drain region, the pn junction structure formed by the collector region and the drain region is tunneled.

10. The semiconductor power device of claim 1, further comprising a columnar doped region with the second conductivity type located below the body region, wherein doped impurities of the columnar doped region and doped impurities of the drift region form a charge balance.

* * * * *